US009299909B2

(12) United States Patent
Galler

(10) Patent No.: US 9,299,909 B2
(45) Date of Patent: Mar. 29, 2016

(54) PIEZOELECTRIC MULTILAYER COMPONENT AND METHOD FOR PRODUCING THE SAME

(75) Inventor: Martin Galler, Graz (AT)

(73) Assignee: EPCOS AG, Munich (DE)

( * ) Notice: Subject to any disclaimer, the term of this patent is extended or adjusted under 35 U.S.C. 154(b) by 403 days.

(21) Appl. No.: 13/825,306

(22) PCT Filed: Sep. 27, 2011

(86) PCT No.: PCT/EP2011/066771
§ 371 (c)(1),
(2), (4) Date: Oct. 4, 2013

(87) PCT Pub. No.: WO2012/041854
PCT Pub. Date: Apr. 5, 2012

(65) Prior Publication Data
US 2014/0015379 A1    Jan. 16, 2014

(30) Foreign Application Priority Data
Oct. 1, 2010   (DE) .......................... 10 2010 047 302

(51) Int. Cl.
| H01L 41/083 | (2006.01) |
| H01L 41/047 | (2006.01) |
| H01L 41/053 | (2006.01) |
| H01L 41/23  | (2013.01) |
| H01L 41/257 | (2013.01) |
| H01L 41/277 | (2013.01) |

(52) U.S. Cl.
CPC ........ *H01L 41/0472* (2013.01); *H01L 41/0533* (2013.01); *H01L 41/083* (2013.01); *H01L 41/23* (2013.01); *H01L 41/257* (2013.01); *H01L 41/277* (2013.01); *Y10T 29/42* (2015.01)

(58) Field of Classification Search
CPC ....................................................... H01L 41/083
USPC ........................................ 310/328, 365, 366
See application file for complete search history.

(56) References Cited

U.S. PATENT DOCUMENTS

| 5,438,232 A * | 8/1995 | Inoue | H01L 41/083 310/328 |
| 6,845,920 B2 * | 1/2005 | Sato | F02M 47/027 239/102.1 |
| 7,065,846 B2 | 6/2006 | Schreiner et al. | |
| 7,205,706 B2 * | 4/2007 | Kadotani | H01L 41/0472 310/328 |

(Continued)

FOREIGN PATENT DOCUMENTS

| DE | 19740570 A1 * | 3/1999 | ............ H01L 41/083 |
| DE | 10021919 A1 | 8/2001 | |

(Continued)

OTHER PUBLICATIONS

Yue, Z., et al., "Effects of Ag-Pd Powder on Ferroelectric and Mechanical Properties of PLZT Ceramics," Key Engineering Materials, vols. 280-283, 2005, pp. 151-154.

*Primary Examiner* — J. San Martin
(74) *Attorney, Agent, or Firm* — Slater & Matsil, L.L.P.

(57) ABSTRACT

The piezoelectric multilayer component includes a piezo stack having an alternating sequence of piezoelectric ceramic layers and inner electrodes, and a passivation on an outer side. The passivation is produced from a piezoelectric ceramic material which is different from the material of the ceramic layers. In the production method, the passivation is polarized together with the ceramic layers.

18 Claims, 1 Drawing Sheet

(56) References Cited

U.S. PATENT DOCUMENTS

| | | | |
|---|---|---|---|
| 7,288,875 B2 * | 10/2007 | Kadotani | H01L 41/273 310/328 |
| 7,443,077 B2 * | 10/2008 | Iwase | H01L 41/293 310/328 |
| 7,990,023 B2 * | 8/2011 | De Paoli | H01L 41/083 310/328 |
| 8,258,677 B2 * | 9/2012 | Denneler | H01L 41/29 310/328 |
| 8,492,955 B2 * | 7/2013 | Kastl | F02M 63/0026 310/328 |
| 2005/0168106 A1 * | 8/2005 | Iwase | H01L 41/273 310/328 |
| 2006/0132001 A1 | 6/2006 | Sugg | |
| 2007/0247025 A1 * | 10/2007 | Sciortino | H01L 41/0533 310/328 |
| 2009/0000092 A1 | 1/2009 | Sugg | |
| 2009/0026890 A1 * | 1/2009 | Goat et al. | H01L 41/083 310/348 |
| 2009/0200895 A1 * | 8/2009 | Rapp | H01L 41/0833 310/314 |
| 2010/0013359 A1 * | 1/2010 | Shoji | H01L 41/0838 310/366 |
| 2010/0019620 A1 * | 1/2010 | Kastl | H01L 41/0533 310/311 |

FOREIGN PATENT DOCUMENTS

| | | |
|---|---|---|
| DE | 10260853 A1 | 7/2004 |
| DE | 102005008363 A1 | 8/2006 |
| EP | 1381094 A2 | 1/2004 |
| EP | 1808906 A2 | 7/2007 |
| JP | 200448015 A | 2/2004 |
| JP | 2008263080 A | 10/2008 |
| JP | 2010212315 A | 9/2010 |

* cited by examiner

PIEZOELECTRIC MULTILAYER COMPONENT AND METHOD FOR PRODUCING THE SAME

This patent application is a national phase filing under section 371 of PCT/EP2011/066771, filed Sep. 27, 2011, which claims the priority of German patent application 10 2010 047 302.2, filed Oct. 1, 2010, each of which is incorporated herein by reference in its entirety.

TECHNICAL FIELD

The present invention relates to a piezoelectric multilayer component which is provided with a passivation which effectively lengthens the lifetime of the component even when subjected to mechanical stress.

BACKGROUND

Piezoelectric multilayer components, in particular multilayer piezo-actuators, are constructed as a sequence of piezoelectric ceramic layers and metallic internal electrodes, designated as piezo-stack hereinafter. In one conventional configuration, the internal electrodes extend as far as a surface of the component, such that at the outer side of the piezo-stack, owing to the high electric field strengths (typically 2 kV/mm), that usually occur, electrical flashovers can occur between internal electrodes that are at different electrical potentials. In order to avoid that, the piezo-stack is provided with a passivation which can form, in particular, an enclosure of the piezo-stack. The breakdown strength of the material of the passivation must be greater than the electric field strengths that occur, and this property must be maintained for all operating states of the component over the entire period of use. Moreover, the passivation should protect the component against external influences (for example against penetrating substances). In addition, the operation of the piezo-actuator places high demands on the mechanical properties of the passivation.

A passivation having the required properties can be produced from ceramic material which has a high breakdown strength and affords good protection of the piezo-stack against external influences. In order that the required properties are maintained, it is important for the passivation not to be damaged during operation of the component and not to acquire any cracks.

The piezo-stack is polarized during the production of the component in order to impress a remanent polarization on it. This results in an expansion of the piezo-stack. The piezo-stack is expanded again during operation of a piezo-actuator. Owing to the fixed connection between the passivation and the piezo-stack, the expansions of the piezo-stack are transmitted to the passivation, such that a tensile stress is built up therein. If the tensile stress exceeds a limit value, cracks form in the passivation.

If the same ceramic material as for the ceramic layers of the piezo-stack is provided as passivation, the passivation is likewise polarized during the polarization of the piezo-stack by the electric leakage fields occurring at the edges of the internal electrodes. That has the effect that during operation of the piezo-actuator the passivation is expanded together with the piezo-stack—although not as greatly as the piezo-stack—and the tensile stress built up in the passivation is lower than without expansion of the passivation. A prerequisite for this is that the passivation is only approximately at most as thick as an individual ceramic layer of the piezo-stack and can therefore be sufficiently polarized. The protection brought about by the passivation may be inadequate, however, owing to the small thickness.

SUMMARY OF THE INVENTION

Embodiments of the present invention specify a possibility as to how a piezoelectric multilayer component can be effectively protected against cracking and external influences.

The piezoelectric multilayer component comprises a piezo-stack having an alternating sequence of piezoelectric ceramic layers and internal electrodes and also a passivation on an outer side. The material of the passivation is a piezoelectric ceramic and is different from the material of the ceramic layers of the piezo-stack.

In exemplary embodiments of the component, the ceramic of the passivation has a lower electric coercive field strength than the ceramic layers of the piezo-stack. The electric coercive field strength is that electric field strength which is necessary to eliminate a polarization of a ferroelectric. The greater the electric coercive field strength, the better the ferroelectric retains its polarization and the piezoelectric property brought about thereby. A material having a low electric coercive field strength can be polarized more easily than a material having a higher electric coercive field strength.

The electric leakage fields proceeding from the edges of the internal electrodes decrease greatly with increasing distance from the internal electrodes. If a material having a low electric coercive field strength is used for the passivation, the passivation can be polarized by the relatively weak electric leakage fields even at a relatively large distance from the internal electrodes. As a result, even in the case of a relatively thick passivation, a continuous polarization is achieved, and the passivation is expanded to a similar extent to the piezo-stack during operation of the component. A passivation composed of such a material is, therefore, permitted to be significantly thicker than an individual ceramic layer of the piezo-stack. A thicker passivation affords a correspondingly better protection. Moreover, a thicker passivation can be produced more easily.

In further exemplary embodiments, the ceramic of the passivation is constituted such that it is expanded to a greater extent by polarization and, on account of the remanent polarization, maintains a greater expansion than the material of the ceramic layers of the piezo-stack under identical polarization conditions, in particular the same polarizing electric field strength. Since the passivation is fixedly connected to the piezo-stack and does not expand to a greater extent than the piezo-stack, a compressive stress acting in the longitudinal direction of the component is built up in the passivation during the joint polarization. A tensile stress that arises in the passivation if the piezo-stack is expanded in the longitudinal direction during operation of the component is therefore reduced by said compressive stress. Mechanical damage to the passivation can thereby be avoided. In these exemplary embodiments, therefore, the passivation has a compressive stress in a longitudinal direction defined by the sequence of ceramic layers and internal electrodes of the piezo-stack, which compressive stress is maintained on account of the fixed connection of the passivation to the piezo-stack and at least partly compensates for a tensile stress that is exerted on the passivation in the case of an expansion of the piezo-stack in the longitudinal direction.

In further exemplary embodiments, the passivation has a thickness which is greater than one and a half times the thickness of an individual one of the ceramic layers of the piezo-stack.

In the method for producing a piezoelectric multilayer component, a piezo-stack having an alternating sequence of piezoelectric ceramic layers and internal electrodes is provided with a passivation comprising a piezoelectric ceramic which is different from the material of the ceramic layers of the piezo-stack. The passivation is polarized together with the ceramic layers of the piezo-stack.

In configurations of the method, for the passivation a ceramic is used which has a lower electric coercive field strength than the material of the ceramic layers of the piezo-stack. When the passivation is polarized together with the ceramic layers of the piezo-stack, a polarization is impressed continuously on the passivation.

In further configurations of the method, the ceramic of the passivation is chosen such that it is expanded to a greater extent than the piezo-stack when a polarization is impressed. The passivation is fixedly connected to the piezo-stack, and the passivation is provided with a compressive stress in the longitudinal direction of the piezo-stack, said longitudinal direction being defined by the alternating sequence of piezoelectric ceramic layers and internal electrodes, when the passivation is polarized together with the ceramic layers of the piezo-stack.

In further configurations of the method, the passivation is produced with a thickness which is greater than one and a half times the thickness of an individual one of the ceramic layers of the piezo-stack.

BRIEF DESCRIPTION OF THE DRAWINGS

Examples of the piezoelectric multilayer component and of the production method are described in greater detail below with reference to the accompanying Figures.

DETAILED DESCRIPTION OF ILLUSTRATIVE EMBODIMENTS

Figure 1:
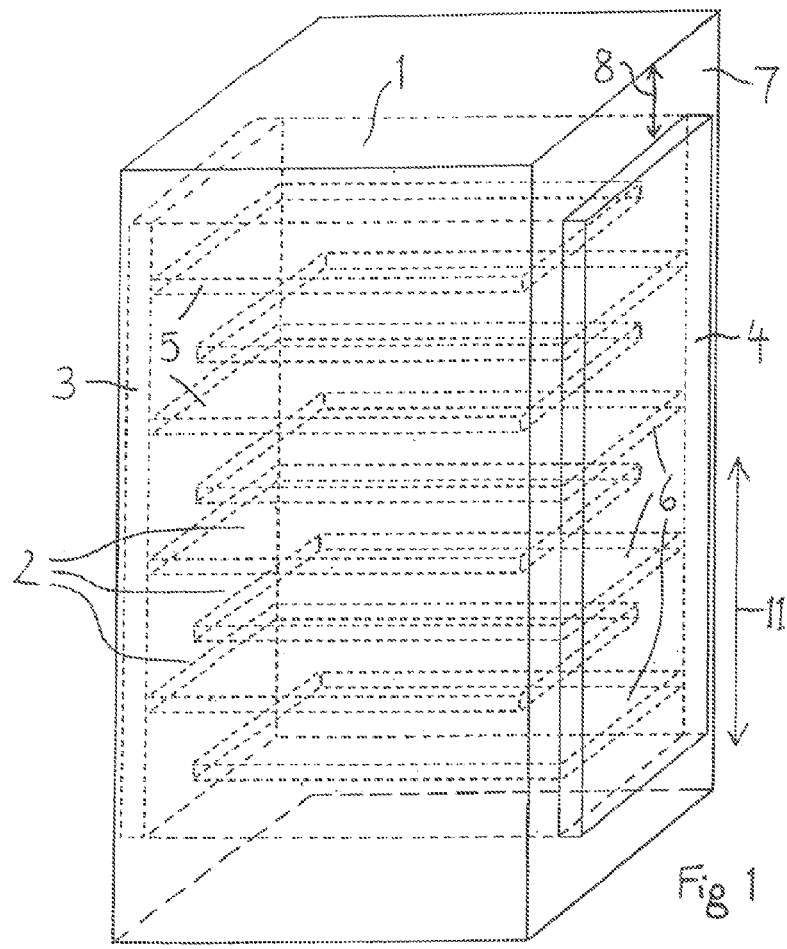
FIG. 1 shows a perspective view of a piezoelectric multilayer component.

FIG. 1 shows a piezoelectric multilayer component comprising a piezo-stack 1 constructed from piezoelectric ceramic layers 2. A respective internal electrode 5, 6 is arranged between two ceramic layers 2 succeeding one another in the piezo-stack 1, such that the piezo-stack 1 contains an alternating sequence of ceramic layers 2 and internal electrodes 5, 6. The internal electrodes 5, 6, in the sequence thereof, are alternately connected to a respective one of two external electrodes 3, 4. In the illustrated example in FIG. 1, a first external electrode 3 is situated on one outer side of the piezo-stack 1 and a second external electrode 4 is situated on the opposite outer side of the piezo-stack 1. Instead of that, other configurations are possible; in particular, the external electrodes 3, 4 can, for example, be drawn around the respective edges of the piezo-stack 1. Moreover, further external electrodes can be provided.

The arrangement illustrated in FIG. 1 is expedient, in particular, for a piezo-actuator which is expanded during operation in the longitudinal direction 11 determined by the alternating sequence of the ceramic layers 2 and internal electrodes 5, 6. The ceramic layers 2 of the piezo-stack 1 are polarized during the production of such a component. As a result, a remanent polarization is impressed on the ceramic layers 2, the direction of said remanent polarization respectively reversing from one ceramic layer 2 to the next ceramic layer 2. A passivation 7 having a thickness 8 covers at least one portion of the outer sides of the piezo-stack 1, in the example in FIG. 1 all outer sides of the piezo-stack 1 which are not covered by the external electrodes 3, 4. With the use of a suitable piezoelectric ceramic as material of the passivation 7, the thickness 8 thereof is permitted to be greater than the thickness of an individual ceramic layer 2 of the piezo-stack 1, in particular greater than one and a half times the thickness of an individual ceramic layer 2.

Figure 2:
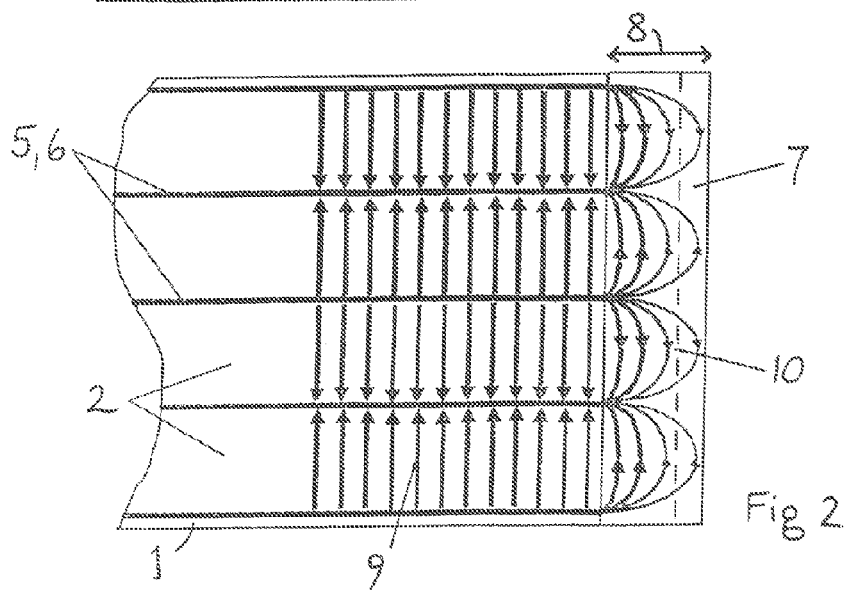
FIG. 2 shows an excerpt from a cross section through a multilayer component in accordance with FIG. 1.

FIG. 2 shows an excerpt from a cross section through the component from FIG. 1 in a plane that is coplanar with respect to the areal extents of the external electrodes 3, 4. FIG. 2 illustrates five of the internal electrodes 5, 6 arranged between ceramic layers 2 of the piezo-stack 1. The external electrodes 3, 4 are situated at a distance from the plane of the cross section in front of and behind the plane of the drawing. FIG. 2 also shows an excerpt from the cross section through the passivation 7 having the thickness 8 arranged on an outer side of the piezo-stack 1. The electric field 9 generated during the polarization of the piezo-stack 1 and during operation of the component is indicated by the vertically aligned parallel arrows. The curved arrows within the cross section of the passivation 7 indicate the lateral leakage field. If the same ceramic material as for the ceramic layers 2 of the piezo-stack 1 is used for the passivation 7, an effective remanent polarization of the passivation 7 can be achieved for example only up to the dashed line. If, instead, a piezoelectric ceramic having a significantly lower electric coercive field strength is used for the passivation, a continuous polarization is achieved even in the regions of the passivation 7 which are at the furthest distance from the piezo-stack 1. On account of the remanent polarization, therefore, the passivation 7 also experiences continuously in its entire thickness 8 a certain expansion in the longitudinal direction 11 of the piezo-stack 1. Mechanical stresses possibly occurring within the passivation 7 can be avoided in this way or are at least significantly lower than with the use of a ceramic having a higher electric coercive field strength.

A further advantage is achieved if the material of the passivation 7 is chosen such that the remanent polarization present after the ceramic layers 2 of the piezo-stack 1 and the passivation 7 have been jointly polarized produces a sufficiently large compressive stress in the passivation 7. Such a compressive stress is produced if the materials are chosen such that the expansion resulting from a remanent polarization present after a process of polarization in the material of the passivation 7 is greater than the expansion resulting from a remanent polarization present after a process of polarization by means of the same electric field strength in the material of the ceramic layers 2. Since the passivation 7 is fixedly connected to the piezo-stack 1, the actual expansions of the piezo-stack 1 and of the passivation 7 correspond, even though they should be different on account of the different material properties. The excessively small expansion of the passivation 7 that is constrained by the piezo-stack 1 is the cause of a compressive stress which occurs in the passivation 7 and which acts in the longitudinal direction 11 of the component. If the piezo-stack 1 is expanded to a greater extent than the passivation 7 during operation of the component on account of the different degrees of polarization of the ceramic layers 2 and of the passivation 7, which, after all, is only polarized by the lateral leakage fields, a tensile stress brought about thereby is at least partly compensated for by the initial compressive stress of the passivation 7. In this way, the mechanical stress that occurs in the passivation 7 can be kept below a critical limit for the mechanical loadability of the component.

A further advantage of the piezoelectric multilayer component is that the ceramic material of the passivation 7 can be optimized taking account of properties which are of secondary importance for the conversion of an electrical voltage into a mechanical stroke and can therefore be changed without the function of the component being impaired. A passivation formed in this way with piezoelectric ceramic thus effectively serves for increasing the robustness of the component to all mechanical stresses. Such a passivation can be used in different types of piezoelectric multilayer components, in particular in multilayer piezo-actuators, independently of design, material, configuration of the internal electrodes, configuration of the external electrodes or other types of external contacts and particular properties of the piezo-stack, in order to improve the robustness and durability of the component.

The invention claimed is:

1. A piezoelectric multilayer component comprising:
a piezo-stack having an alternating sequence of piezoelectric ceramic layers and internal electrodes; and
a passivation on an outer side of the piezo-stack, wherein the passivation comprises a piezoelectric ceramic that is different from a material of the ceramic layers of the piezo-stack;
wherein the ceramic of the passivation has a lower electric coercive field strength than the ceramic layers of the piezo-stack.

2. The piezoelectric multilayer component according to claim 1, wherein the passivation is polarized continuously, and wherein polarization of the passivation extends into regions of the passivation which are at a furthest distance from the piezo stack.

3. The piezoelectric multilayer component according to claim 2, wherein the passivation has a thickness that is greater than one and a half times a thickness of an individual one of the ceramic layers of the piezo-stack.

4. The piezoelectric multilayer component according to claim 1, wherein the passivation has a thickness that is greater than one and a half times a thickness of an individual one of the ceramic layers of the piezo-stack.

5. A piezoelectric multilayer component comprising:
a piezo-stack having an alternating sequence of piezoelectric ceramic layers and internal electrodes; and
a passivation on an outer side of the piezo-stack, wherein the passivation comprises a piezoelectric ceramic that is different from a material of the ceramic layers of the piezo-stack;
wherein the passivation is polarized continuously.

6. The piezoelectric multilayer component according to claim 5, wherein the passivation has a thickness that is greater than one and a half times a thickness of an individual one of the ceramic layers of the piezo-stack.

7. A piezoelectric multilayer component comprising: a piezo-stack having an alternating sequence of piezoelectric ceramic layers and internal electrodes; and
a passivation on an outer side of the piezo-stack, wherein the passivation comprises a piezoelectric ceramic that is different from a material of the ceramic layers of the piezo-stack;
wherein the ceramic of the passivation is constituted such that it is expanded to a greater extent by impression of a polarization than the material of the ceramic layers of the piezo-stack.

8. The piezoelectric multilayer component according to claim 7, wherein the passivation has a compressive stress in a longitudinal direction of the piezo-stack, the longitudinal direction being defined by the sequence of ceramic layers and internal electrodes;
wherein the compressive stress is maintained on account of a fixed connection of the passivation to the piezo-stack; and
wherein the compressive stress at least partly compensates for a tensile stress exerted on the passivation in the case of an expansion of the piezo-stack in the longitudinal direction.

9. A piezoelectric multilayer component comprising: a piezo-stack having an alternating sequence of piezoelectric ceramic layers and internal electrodes; and
a passivation on an outer side of the piezo-stack, wherein the passivation comprises a piezoelectric ceramic that is different from a material of the ceramic layers of the piezo-stack;
wherein the passivation has a compressive stress in a longitudinal direction of the piezo-stack, the longitudinal direction being defined by the sequence of ceramic layers and internal electrodes.

10. A piezoelectric multilayer component comprising:
a piezo-stack having an alternating sequence of piezoelectric ceramic layers and internal electrodes; and
a passivation on an outer side of the piezo-stack, wherein the passivation comprises a piezoelectric ceramic that is different from a material of the ceramic layers of the piezo-stack;
wherein the passivation has a thickness that is greater than one and a half times a thickness of an individual one of the ceramic layers of the piezo-stack.

11. A method for producing a piezoelectric multilayer component, the method comprising:
forming a piezo-stack having an alternating sequence of piezoelectric ceramic layers and internal electrodes;
applying a passivation to the piezo-stack, the passivation comprising a piezoelectric ceramic that is different from the material of the ceramic layers of the piezo-stack; and
polarizing the passivation together with the ceramic layers of the piezo-stack.

12. The method according to claim 11, wherein the ceramic of the passivation has a lower electric coercive field strength than a material of the ceramic layers of the piezo-stack.

13. The method according to claim 11, wherein a polarization is impressed continuously on the passivation when the passivation is polarized together with the ceramic layers of the piezo-stack.

14. The method according to claim 11, wherein
the ceramic of the passivation is chosen such that it is expanded to a greater extent than the piezo-stack when a polarization is impressed;
the passivation is fixedly connected to the piezo-stack; and
the passivation is provided with a compressive stress in a longitudinal direction of the piezo-stack, the longitudinal direction being defined by the alternating sequence of piezoelectric ceramic layers and internal electrodes, when the passivation is polarized together with the ceramic layers of the piezo-stack.

15. The method according to claim 11, wherein the passivation is produced with a thickness that is greater than one and a half times the thickness of an individual one of the ceramic layers of the piezo-stack.

16. The method according to claim 11, wherein the ceramic of the passivation is chosen such that it is expanded to a greater extent than the piezo-stack when a polarization is impressed.

17. The method according to claim 11, wherein the passivation is fixedly connected to the piezo-stack.

18. The method according to claim 11, wherein the passivation is provided with a compressive stress in a longitudinal direction of the piezo-stack, the longitudinal direction being defined by the alternating sequence of piezoelectric ceramic layers and internal electrodes, when the passivation is polarized together with the ceramic layers of the piezo-stack.

* * * * *